(12) United States Patent
Li et al.

(10) Patent No.: US 9,274,433 B2
(45) Date of Patent: Mar. 1, 2016

(54) FLY EYE LENS AND PROXIMITY EXPOSURE MACHINE OPTICAL SYSTEM

(71) Applicants: BOE Technology Group Co., Ltd., Beijing (CN); Beijing BOE Display Technology Co., Ltd., Beijing (CN)

(72) Inventors: Min Li, Beijing (CN); Hongjiang Wu, Beijing (CN); Gyuhyun Lee, Beijing (CN); Jikai Zhang, Beijing (CN); Tonghua Yang, Beijing (CN)

(73) Assignees: BOE Technology Group Co., Ltd., Beijing (CN); Beijing BOE Display Technology Co., Ltd., Beijing (CN)

(*) Notice: Subject to any disclaimer, the term of this patent is extended or adjusted under 35 U.S.C. 154(b) by 281 days.

(21) Appl. No.: 14/065,647

(22) Filed: Oct. 29, 2013

(65) Prior Publication Data
US 2014/0168621 A1 Jun. 19, 2014

(30) Foreign Application Priority Data
Dec. 14, 2012 (CN) .......................... 2012 1 0546098

(51) Int. Cl.
*G03F 7/20* (2006.01)

(52) U.S. Cl.
CPC .......... *G03F 7/70083* (2013.01); *G03F 7/7035* (2013.01); *G03F 7/70058* (2013.01); *G03F 7/70066* (2013.01); *G03F 7/70075* (2013.01)

(58) Field of Classification Search
CPC .............. G03F 7/70075; G03F 7/7035; G03F 7/70066; G03F 7/70058; G03F 7/70083
See application file for complete search history.

(56) References Cited

U.S. PATENT DOCUMENTS

| 6,769,777 B1 | 8/2004 | Dubin et al. | |
| 2007/0190438 A1* | 8/2007 | Kim et al. | 430/30 |
| 2009/0201481 A1* | 8/2009 | Gerhard | G03F 7/70075 355/67 |
| 2013/0112667 A1* | 5/2013 | Holmgren et al. | 219/121.6 |

FOREIGN PATENT DOCUMENTS

| CN | 1438546 A | 8/2003 |
| CN | 2888465 Y | 4/2007 |
| CN | 101595572 A | 12/2009 |
| JP | 2647602 B | 5/1997 |

* cited by examiner

*Primary Examiner* — Toan Ton
*Assistant Examiner* — Michelle M Iacoletti
(74) *Attorney, Agent, or Firm* — Frommer Lawrence & Haug LLP

(57) ABSTRACT

An embodiment of the present invention provides a fly eye lens which is applied to a proximity exposure machine optical system. The fly lens includes a first lens assembly and a second lens assembly, wherein the first lens assembly includes a plurality of lenses which form a first lens face, and the second lens assembly includes a plurality of lenses which form a second lens face. The first lens face is used to split an incident broad light beam into narrow light beams and then refract the narrow light beams onto the second lens face, and the second lens face is used to dispersively refract the received narrow light beams onto a concave mirror in the optical system. A lens closer to a center of the second lens face has a higher transmittivity, and a lens farther from the center of the second lens face has a lower transmittivity. According to the embodiment of the present invention, since different lenses on the second lens face have different transmittivities, the illuminances of light radiated to different regions of a mask plate through the fly eye lens are different, and thus the uniformity of the critical dimensions of the exposed patterns can be improved to a certain extent.

20 Claims, 4 Drawing Sheets

FLY EYE LENS AND PROXIMITY EXPOSURE MACHINE OPTICAL SYSTEM

FIELD OF THE INVENTION

The present invention relates to the field of optics, and more particularly, to a fly eye lens and a proximity exposure machine optical system.

BACKGROUND OF THE INVENTION

With development of display technology, a display device with large size, high quality and low cost is the trend. Quality of a color filter which is a major component of a display device (for example, a TFT-LCD display device) determines the display effect of the display device.

At present, a proximity exposure machine optical system is mostly used to perform exposure when fabricating a color filter. Specifically, as shown in FIG. 1, the above mentioned optical system includes an exposure lamp 101, a first planar mirror 102, a fly eye lens 103, a concave mirror 104 and a second planar mirror 105, and further includes a mask plate 106, a substrate 107, an exposure region 108 and a photoresist (not shown in FIG. 1). In this optical system, the exposure lamp 101 is mainly used to emit a light beam to the first planar mirror 102, the first planar mirror 102 is mainly used to reflect an incident light beam onto the fly eye lens 103, the fly eye lens 103 is mainly used to split the received light beam into narrow light beams and then refract the narrow light beams onto the concave mirror 104, the concave mirror 104 is mainly used to reflect the received light beam onto the second planar mirror 105, and the second planar mirror 105 is mainly used to reflect the received light beam onto the mask plate 106. Generally, the concave mirror 104 and the second planar mirror 105 are designed based on a principle that reflectivities of light at respective positions on the mirror are equal so as to guarantee the uniformity of light at different positions in the optical system.

Here, the fly eye lens 103 may include a first lens assembly and a second lens assembly. The first lens assembly includes a plurality of lenses forming a first lens face, and the second lens assembly includes a plurality of lenses forming a second lens face. The first lens face is used to split a broad light beam reflected from the first planar mirror 102 into narrow light beams and then refract the narrow light beams onto the second lens face, and the second lens face is used to dispersively refract the received narrow light beams onto the concave mirror 104. In general, there is positional correspondence existing between the fly eye lens 103 and the concave mirror 104, that is, a lens closer to the center on the second lens face contributes more illuminance to a point closer to the center on a surface of the concave mirror 104 but contributes less illuminance to a point farther from the center on a surface of the concave mirror 104; on the contrary, a lens farther from the center on the second lens face contributes more illuminance to a point farther from the center on the surface of the concave mirror 104 but contributes less illuminance to a point closer to the center on the surface of the concave mirror 104.

When performing the proximity exposure, generally, the illuminance of incident light on the mask plate is evenly distributed, that is, illuminance at any region on the mask plate is identical. In this case, as shown in FIG. 2, when fabricating a color filter using a substrate 201 (for example, a glass substrate), a mask plate 202 and a photoresist 203, a distance between the mask plate 202 before being bent and the substrate 201 ranges from one hundred micrometers to several hundred micrometers. As such, as to the mask plate, it is bent when performing the exposure, which causes the exposure distance in a vertical direction between the substrate 201 and the central region of the mask plate 202 to differ from that between the substrate 201 and an edge region of the mask plate 202. For example, as shown in FIG. 2, the exposure distance G2 between the substrate 201 and the central region of the mask plate 202 is smaller than the exposure distance G1 between the substrate 201 and the edge region of the mask plate 202. During a usual fabricating process, since the proximity exposure machine optical system is influenced by factors such as diffraction angle and light parallelism when performing the exposure, the critical dimension (CD) of the pattern exposed on the substrate 201 is increased as the exposure distance of each region is increased (as shown in FIG. 2). Thus, in a case where the illuminance is fixed, since the exposure distance in the central region is shorter than that in an edge region, the critical dimension of the pattern exposed on the central region is smaller than that of the pattern exposed on an edge region, that is, the critical dimensions of the exposed patterns are not uniform (for example, CD2>CD1, as shown in FIG. 1). In other words, the critical dimensions of the patterns exposed by the above-mentioned optical system have a poor uniformity.

It can be seen from the above fabricating manner that when the proximity exposure machine optical system performs the exposure, the bending of the mask plate causes exposure distances in respective regions to vary so that the critical dimensions of the patterns exposed on the substrate have a poor uniformity and the quality of the color filter is further affected.

SUMMARY OF THE INVENTION

The present invention provides a fly eye lens and a proximity exposure machine optical system to solve the problem of poor uniformity in critical dimensions of the exposed patterns caused by the bending of a mask plate.

In view of the above problem, according to a first aspect of the present invention, a fly eye lens applied to a proximity exposure machine optical system is provided. The fly eye lens includes a first lens assembly which includes a plurality of lenses forming a first lens face and a second lens assembly which includes a plurality of lenses forming a second lens face. The first lens face is used to split an incident broad light beam into narrow light beams and then refract the narrow light beams onto the second lens face, and the second lens face is used to dispersively refract the received narrow light beams onto a concave mirror in the optical system. Among the plurality of lenses in the second lens assembly, a lens closer to the center of the second lens face has a higher transmittivity, and a lens farther from the center of the second lens face has a lower transmittivity.

According to a second aspect of the present invention, a proximity exposure machine optical system including the fly eye lens according to the first aspect is provided.

By providing a fly eye lens including a first lens assembly and a second lens assembly, wherein, the first lens assembly includes a plurality of lenses forming the first lens face, the second lens assembly includes a plurality of lenses forming the second lens face, among the plurality of lenses in the second lens assembly, a lens closer to the center of the second lens face has a higher transmittivity; and a lens farther from the center of the second lens face has a lower transmittivity, the embodiment of the present invention has the following advantageous effects. When the proximity exposure machine performs the exposure, the critical dimension of the exposed pattern is generally increased as the illuminance (exposure amount) is increased and is reduced as the exposure distance is reduced, but since the lenses in the second lens assembly have different transmittivities, the illuminances at different positions, to which the second lens face radiates light beams, on the mask plate are different so that the change in critical dimensions of the patterns due to different exposure distances at respective positions on the mask plate can be relatively compensated. The fly eye lens of the present invention and the proximity exposure machine optical system including the fly eye lens can be used to improve the uniformity of the critical dimensions of the exposed patterns to a certain extent.

DETAILED DESCRIPTION OF THE PREFERRED EMBODIMENTS

An existing mask plate is bent when a proximity exposure machine optical system performs exposure, and as a result, the exposure distance in a central region of the mask plate (i.e., a distance in a vertical direction between the central region and a substrate of the proximity exposure machine) is shorter than that in an edge region of the mask plate. Thus, in a case where other conditions, such as exposure amount, are fixed, the critical dimension of a pattern exposed on a central region of the substrate is smaller than that of a pattern exposed on an edge region of the substrate so that the critical dimensions of the exposed patterns have a poor uniformity. In view of the above problem, the present invention provides a fly eye lens which can be used to improve the uniformity of the critical dimensions of the exposed patterns to a certain extent.

The specific implementing manner of the fly eye lens according to an embodiment of the present invention will be described in connection with the accompanying drawings of the description.

Figure 4:
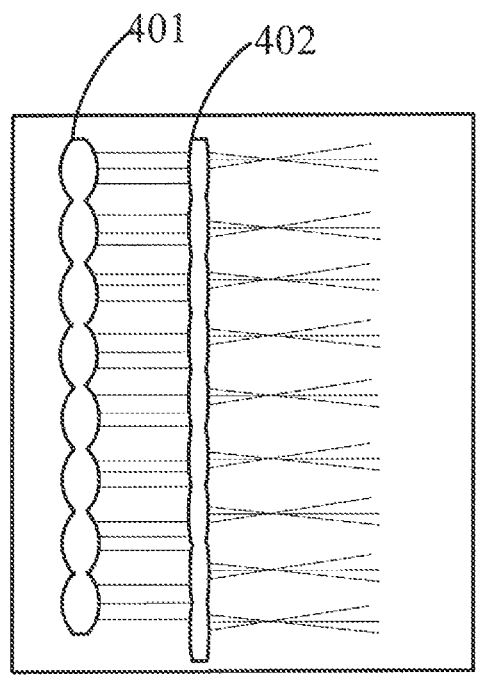
FIG. 4 is a schematic diagram showing a structure of a fly eye lens according to an embodiment of the present invention.

As shown in FIG. 4, the embodiment of the present invention provides a fly eye lens which includes a first lens assembly 401 and a second lens assembly 402. Here, the first lens assembly includes a plurality of lenses which form a first lens face, and the second lens assembly includes a plurality of lenses which form a second lens face.

The above mentioned first lens face is mainly used to split a broad light beam reflected by a first planar mirror in the proximity exposure machine optical system into narrow light beams and then refract the narrow light beams onto the second lens face, and the above mentioned second lens face is mainly used to dispersively refract the received narrow light beams onto a concave mirror in the proximity exposure machine optical system.

According to the embodiment of the present invention, among the plurality of lenses in the second lens assembly, a lens which is closer to the center of the second lens face has a higher transmittivity, and a lens which is farther from the center of the second lens face has a lower transmittivity. Specifically, the distance from each of the lenses in the second lens assembly to the center of the second lens face may be determined by measuring a distance from a center of each lens in the second lens assembly to the center of the second lens face. Of course, other determination manners can also be used but will not be listed one by one.

Hereinafter, for simplification of description, the step in which the light beams refracted by the second lens face are sequentially reflected by the concave mirror 104 and a second planar mirror 105 before reaching a mask plate 502 will be omitted.

Figure 5:
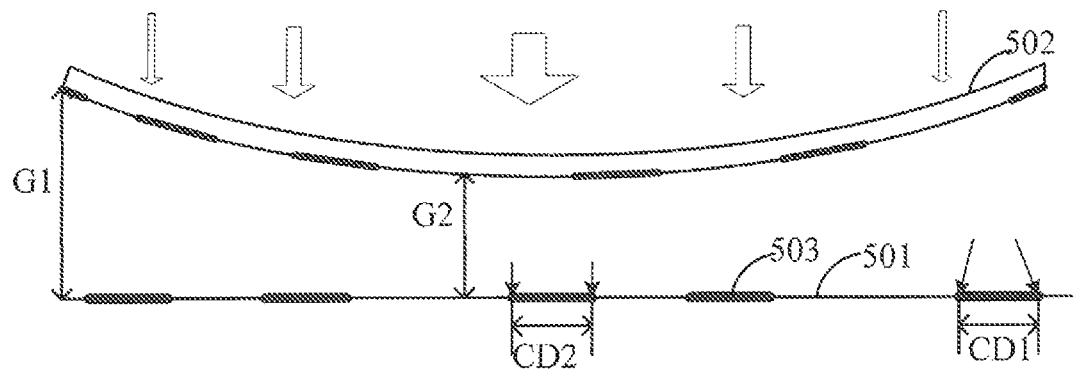
FIG. 5 is a schematic diagram showing operation of a mask plate when the fly eye lens according to the embodiment of the present invention performs proximity exposure.

As shown in FIG. 5, when a substrate 501, a mask plate 502 and a photoresist 503 are used to fabricate a color filter, the exposure distance G1 at a point on the mask plate 502 other than the center of the mask plate (for example, a point on an edge of the mask plate) is larger than the exposure distance G2 at the center of the mask plate 502. Since among the plurality of lenses in the second lens assembly of the fly eye lens, the lens which is closer to the center of the second lens face has a higher transmittivity and the lens which is farther from the center of the second lens face has a lower transmittivity, the illuminance at a point, to which the second lens face finally refracts the light beams, other than the center of the mask plate is relatively weak (the exposure amount at the point is relatively small), which relatively compensates the influence on the critical dimensions of the patterns by the exposure distance at the point; correspondingly, as to the center of the mask plate 502, the exposure amount at the center is relatively large, which relatively compensates the influence on the critical dimensions of the patterns by the exposure distance at the center. As such, the uniformity of the critical dimensions of the exposed patterns can be improved to a certain extent (as shown in FIG. 5, CD1 is substantially equal to CD2).

Preferably, the transmittivities of the lenses in the second lens assembly within a range from 60% to 100%, and this range can relatively compensate the influence on the critical dimensions of the patterns by the exposure amount and the exposure distance. Of course, the range of the above transmittivities is not limited thereto and may be other ranges, for example, a range determined according to the bending degree of the mask plate caused by the proximity exposure machine.

Figure 6:
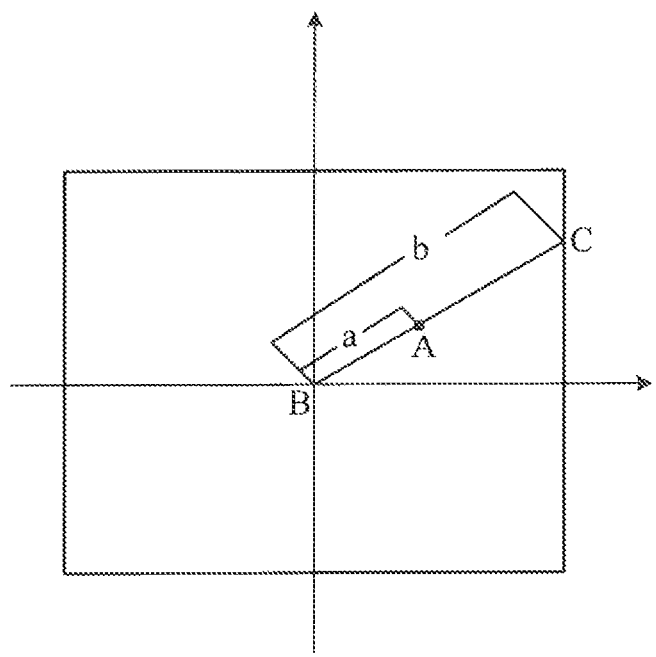
FIG. 6 is a schematic diagram showing a distance between a center of the mask plate and an intersection on an edge of the mask plate when the fly eye lens according to the embodiment of the present invention performs the proximity exposure.

Preferably, on the concave mirror to which the second lens refracts the received light beams, the illuminance at a selected point other than the center is:

$$\sum_{i,j} T_{ij} \times P_{Eij}(x, y) = P_0 - \Delta P$$

wherein $T_{ij}$ denotes a transmittivity of a lens in the second lens assembly, $$\sum_{i,j} T_{ij} \times P_{Eij}(x, y)$$

denotes an illuminance on the concave mirror onto which the second lens face refracts the received light beams, $P_0$ denotes a known illuminance at the center of the concave mirror, $\Delta P$ denotes a difference of the illuminance at the selected point other than the center and the illuminance at the center, specifically.

$$\Delta P = \Delta T = \frac{1}{t} \times \frac{K_1}{K_2} \times H \times \left[1 - \left(\frac{l}{L}\right)^n\right]$$

wherein $\Delta T$ denotes a difference of the illuminance at the selected point other than the center and the illuminance at the center on the mask plate, to which the second lens face refracts the received light beams, in the optical system, t, n, $K_1$ and $K_2$ are constants, $0<K_1<1$, $0<K_2<1$, and $n>1$, l denotes a distance between the selected point other than the center of the mask plate and the center of the mask plate (as shown in FIG. 6, this distance can be obtained from coordinates (x, y) of the selected points, for example, as to the point A in FIG. 6 distance between the center B of the mask plate and the point A is a), L denotes a distance between the center of the mask plate and an intersection on an edge of the mask plate, the intersection is a point at which a straight line formed by connecting the selected point and the center intersects with the edge of the mask plate.

Here, the intersection is a point at which the straight line formed by connecting the selected point on the mask plate and the center of the mask plate intersects with the edge of the mask plate. As shown in FIG. 6, still taking point A as an example, distance between the center B and the intersection C is b.

H denotes a maximum variation of amount of an exposure distance at the center of the mask plate.

Taking one selected point on the mask plate other than the center of the mask plate as an example, a procedure of calculating a difference between the illuminance at the one selected point and the illuminance at the center of the mask plate will be described below.

Firstly, the mask plate is placed on a mask plate support in the proximity exposure machine optical system. When the proximity exposure machine performs exposure, the mask plate is bent. In this case, a variation of amount $\Delta h$ of the exposure distance at the selected point on the mask plate with respect to that at the center of the mask plate can be determined by the following formula 1:

$$\Delta h = H \times \left[1 - \left(\frac{l}{L}\right)^n\right] \quad (1)$$

wherein l denotes a distance between the selected point on the mask plate and the center of the mask plate, L denotes a distance between an intersection which is a point at which a straight line formed by connecting the selected point and the center intersects with an edge of the mask plate and the center of the mask plate.

H denotes a maximum variation of amount of an exposure distance at the center of the mask plate, n is a deformation coefficient of the mask plate, $n>1$.

Figure 1:
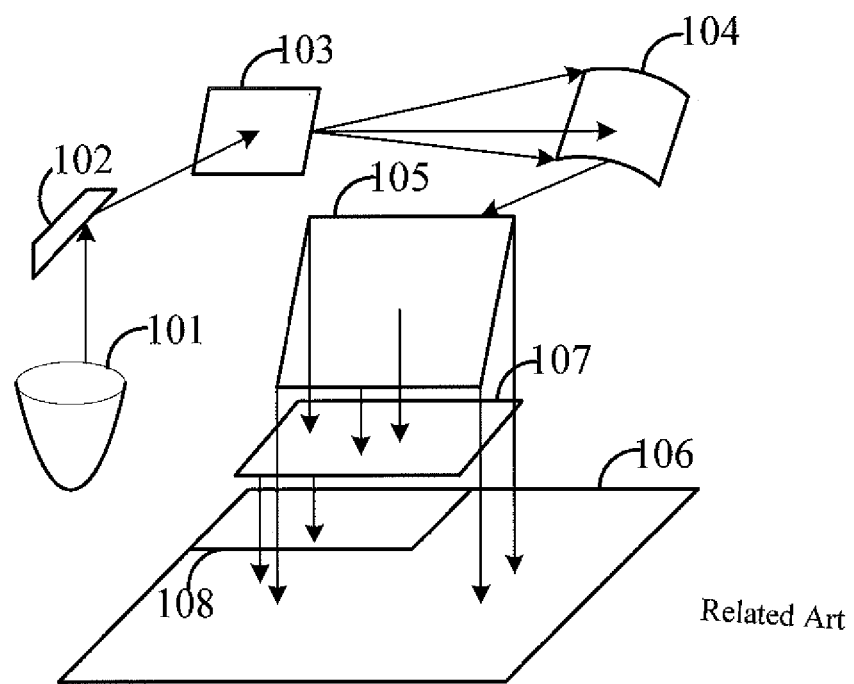
FIG. 1 is a schematic diagram showing a structure of an existing proximity exposure machine optical system.
Figure 2:
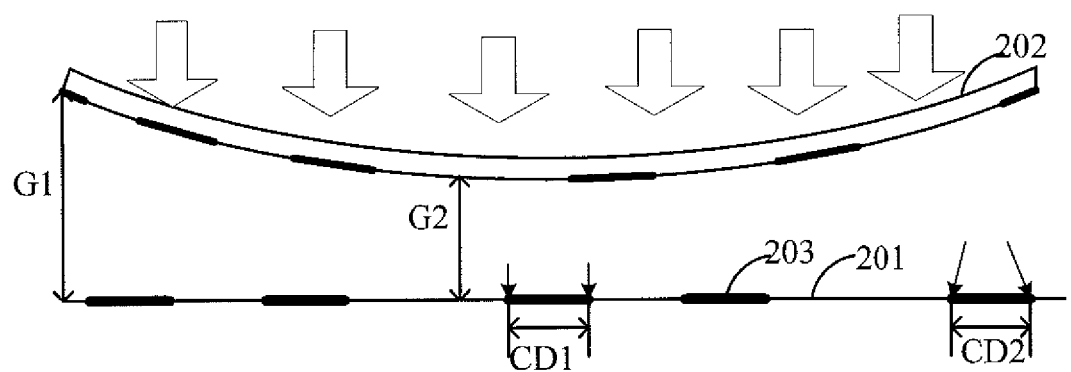
FIG. 2 is a schematic diagram showing operation of a mask plate when the existing proximity exposure machine optical system performs exposure.
Figure 3:
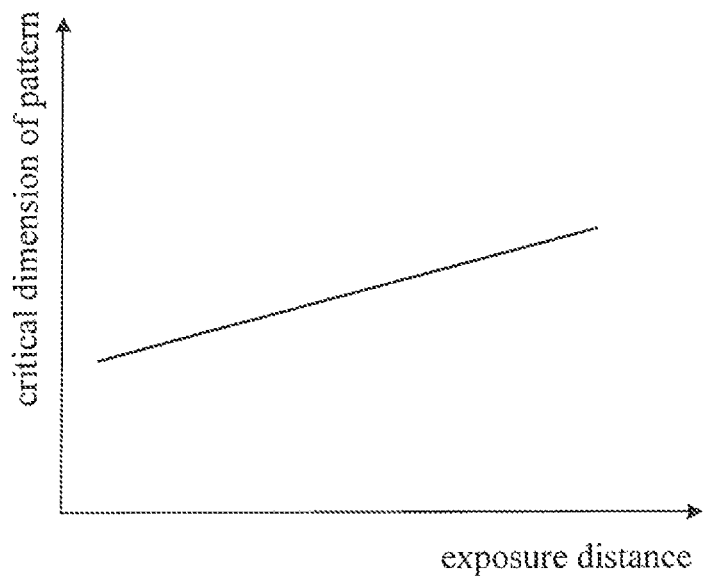
FIG. 3 is a graph showing a relation between critical dimensions of patterns and exposure distances when the existing proximity exposure machine optical system performs the exposure.

Next, when the proximity exposure machine optical system performs the exposure, assuming that the exposure amounts radiated to respective regions of the mask plate are identical, a variation of amount ($\Delta CD$) of the critical dimension of the pattern exposed at the selected point on the mask plate with respect to that of the pattern exposed at the center of the mask plate is in direct proportion to the variation of amount $\Delta h$ of the exposure distance at the selected point with respect to that at the center (as shown in FIG. 3), and this direct proportion can be expressed by the following formula 2:

$$\Delta CD = K_1 \times \Delta h \quad (2)$$

wherein $K_1$ is a constant determined by characteristics of the potoresist, for example, $0<K_1<1$.

Assuming that the exposure distances in the respective regions of the mask plate are identical, a variation of amount ($\Delta CD$) of the critical dimension of the pattern exposed at the selected point on the mask plate with respect to the that of the pattern exposed at the center of the mask plate is in direct proportion to a variation of amount ($\Delta Q$) of the exposure amount at the selected point with respect to that at the center, and the direct proportion can be expressed by the following formula 3:

$$\Delta CD = K_2 \times \Delta Q \quad (3)$$

wherein $K_2$ is a constant decided by characteristics of the potoresist, for example, $0<K_2<1$.

To make the critical dimensions of the patterns exposed in respective regions of the mask plate substantially equal to each other when performing proximity exposure, the above formulae 2 and 3 should be equal, and thus the uniformity of the critical dimensions of the patterns can be improved to a certain extent.

In a case where the above formulae 2 and 3 are equal, the variation of amount ($\Delta Q$) of the exposure amount at the selected point on the mask plate with respect to the exposure amount at the center of the mask plate can be obtained (the following formula 4):

$$\Delta Q = H \times \left[1 - \left(\frac{l}{L}\right)^n\right] \quad (4)$$

After the variation of amount $\Delta Q$ of the exposure amount at the selected point on the mask plate with respect to that at the center of the mask plate is obtained, in order to improve the uniformity of the critical dimensions of the patterns exposed on the substrate when the proximity exposure machine performs the exposure, the transmittivity of each lens in the second lens assembly can be changed, such that the variation of amount of the exposure amount at the selected point on the mask plate with respect to that at the center of the mask plate is in direct proportion to the variation of amount (difference) of the illuminance at the selected point on the mask plate with respect to the illuminance at the center of the mask plate, and the direct proportion can be expressed by the following formula 5:

$$\Delta Q = \Delta T \times t \quad (5)$$

In the above formula 5, t denotes exposure time and is a constant. The difference (variation of amount) $\Delta T$ of the illuminance at the selected point, on the mask plate, to which the second lens face refracts the received light beams, with respect to the illuminance at the center of the mask plate to which the second lens face refracts the received light beams can be obtained by combining the formulae 4 and 5 (the following formula 6):

$$\Delta T = \frac{1}{t} \times \frac{K_1}{K_2} \times H \times \left[1 - \left(\frac{l}{L}\right)^n\right] \quad (6)$$

Next, taking one selected point on the concave mirror as an example, a procedure of calculating the illuminance at the one selected point to which the second lens face refracts the light beams will be described.

Figures 7, 8:
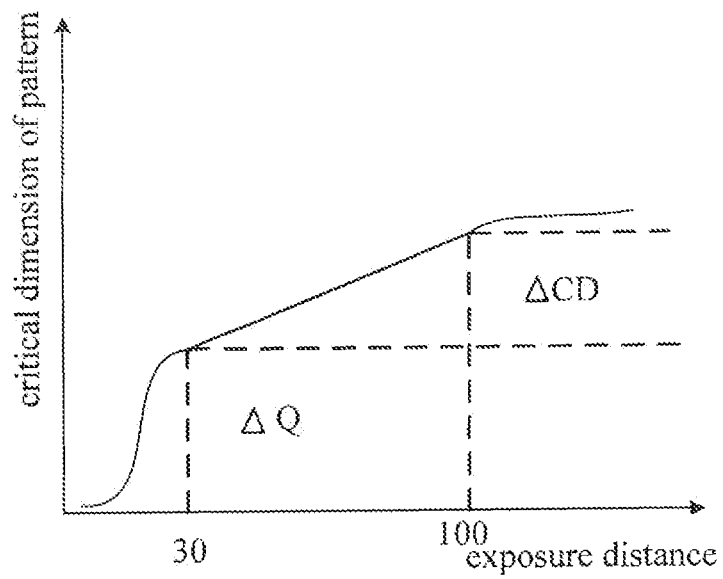
FIG. 7 is a schematic diagram showing a relation between variation of critical dimension of pattern exposed at any point other than a center with respect to that of pattern exposed at the center and variation of amount of exposure amount at any point other than the center with respect to that of the center, on the mask plate to which the second lens face refracts the received light beams.
FIG. 8 is a front view of respective lenses $B_{ij}$ in the second lens assembly provided by the embodiment of the present invention.

In the embodiment of the present invention, as shown in FIG. 8, the second lens assembly includes many lenses (for example, $B_{11}, \ldots, B_{mn}$). As to any lens $B_{ij}$ in the second lens assembly, the illuminance at any one point on the concave mirror to which the lens $B_{ij}$ refracts the light beams is $P_{Eij}(x, y)$.

Assuming that the coordinate of the selected point on the concave mirror is (x, y) and that the transmittivity corresponding to the above described lens $B_{ij}$ (other than the lens closest to the center of the second lens face) is $T_{ij}$, the illuminance at this selected point to which the second lens face refracts the light beams is $$\sum_{i,j} T_{ij} \times P_{Eij}(x, y).$$

Since on the concave mirror to which the second lens face refracts the light beams, the illuminance $P_0$ at the center is a constant, if the difference between the illuminance at the selected point and the illuminance at the center is $\Delta P$, the illuminance at the selected point is $P_0 - \Delta P$, and thus the following formula 7 will be obtained.

$$\sum_{i,j} T_{ij} \times P_{Eij}(x, y) = P_0 - \Delta P \quad (7)$$

Here, since the difference between the illuminance at the selected point on the concave mirror and the illuminance at the center of the concave mirror is equal to the difference between the illuminance at the selected point on the mask plate and the illuminance at the center of the mask plate, the transmittivity of each lens in the second lens assembly can be obtained according to the coordinates of the previously selected points and the formulae 6 and 7. For example, if the second lens assembly includes eleven lenses, eleven points can be selected on the concave mirror and the mask plate, respectively, and the transmittivity of each lens in the second lens assembly can be obtained according to the above formulae 6 and 7.

The embodiment of the present invention provides a fly eye lens which is applied to a proximity exposure machine optical system. The fly eye lens includes a first lens assembly which includes the plurality of lenses forming the first lens face and a second lens assembly which includes the plurality of lenses forming the second lens face, wherein among the plurality of lenses in the second lens assembly, the lens closer to the center of the second lens face has a higher transmittivity and the lens farther from the center of the second lens face has a lower transmittivity. When the proximity exposure machine performs the exposure, although the critical dimension of the exposed pattern is generally increased as the illuminance (exposure amount) is increased and is reduced as the exposure distance is reduced, according to the embodiment of the present invention, since the lenses in the second lens assembly have different transmittivities, the illuminances at different positions on the mask plate to which the second lens face refracts the light beams are different so that the change in critical dimensions of the patterns due to different exposure distances in respective regions on the mask plate can be relatively compensated. The fly eye lens of the present invention and the proximity exposure machine optical system including the fly eye lens can be used to improve the uniformity of the critical dimensions of the exposed patterns to a certain extent.

According to another aspect of the present invention, there is provided a proximity exposure machine optical system including the fly eye lens according to the embodiment of the present invention.

Obviously, the person skilled in the art can make various variations and modifications to the present invention without departing from the spirit and scope of the present invention. Thus, if these variations and modifications are within the range defined by the claims of the present invention and the equivalent technique thereof, the present invention is intended to include all these variations and modifications.

What is claimed is:

1. A fly eye lens applied to a proximity exposure machine optical system, comprising:
    a first lens assembly which includes a plurality of lenses forming a first lens face; and
    a second lens assembly which includes a plurality of lenses forming a second lens face,
    wherein the first lens face is used to split an incident broad light beam into narrow light beams and then refract the narrow light beams onto the second lens face, and the second lens face is used to dispersively refract the received narrow light beams onto a concave mirror in the optical system,
    among the plurality of lenses in the second lens assembly, a lens which is closer to a center of the second lens face has a higher transmittivity than a lens which is farther from the center of the second lens face.

2. The fly eye lens according to claim 1, wherein transmittivities of the lenses in the second lens assembly are between 60% and 100%.

3. The fly eye lens according to claim 2, wherein
    a lens closest to the center of the second lens face in the second lens assembly has a highest transmittivity among the plurality of lenses forming the second lens face.

4. The fly eye lens according to claim 3, wherein
    a distance from each lens in the second lens assembly to the center of the second lens face is defined as a distance from a center of each lens in the second lens assembly to the center of the second lens face.

5. The fly eye lens according to claim 2, wherein
    a distance from each lens in the second lens assembly to the center of the second lens face is defined as a distance from a center of each lens in the second lens assembly to the center of the second lens face.

6. The fly eye lens according to claim 1, wherein
the transmittivity of each lens in the second lens assembly can be obtained by the following formulae:

$$\sum_{i,j} T_{ij} \times P_{Eij}(x, y) = P_0 - \Delta P$$

$$\Delta P = \Delta T = \frac{1}{t} \times \frac{K_1}{K_2} \times H \times \left[1 - \left(\frac{l}{L}\right)^n\right]$$

wherein $T_{ij}$ denotes a transmittivity of each lens in the second lens assembly, $$\sum_{i,j} T_{ij} \times P_{Eij}(x, y)$$

denotes illuminance on the concave mirror onto which the second lens face refracts the received light beams, $P_0$ denotes a known illuminance at a center of the concave mirror, $\Delta P$ denotes a difference of the illuminance at the selected point other than the center and the illuminance at the center, on the concave mirror to which the second lens face refracts the received light beams, $\Delta T$ denotes a difference of an illuminance at the selected point other than a center and an illuminance at the center, on a mask plate, to which the second lens face refracts the received light beams, in the optical system, t, n, $K_1$ and $K_2$ are constants, $0<K_1<1$, $0<K_2<1$, and $n>1$, l denotes a distance between the selected point other than the center on the mask plate and the center of the mask plate, L denotes a distance between the center of the mask plate and an intersection, which is a point at which a straight line formed by connecting the selected point on the mask plate and the center of the mask plate intersects with an edge of the mask plate, on the edge of the mask plate, and H denotes a maximum variation of amount of an exposure distance at the center of the mask plate.

7. The fly eye lens according to claim 6, wherein
a distance from each lens in the second lens assembly to the center of the second lens face is defined as a distance from a center of each lens in the second lens assembly to the center of the second lens face.

8. The fly eye lens according to claim 1, wherein
the transmittivities of the lenses in the second lens assembly are determined according to a bending degree of a mask plate caused by the proximity exposure machine optical system.

9. The fly eye lens according to claim 8, wherein
a distance from each lens in the second lens assembly to the center of the second lens face is defined as a distance from a center of each lens in the second lens assembly to the center of the second lens face.

10. The fly eye lens according to claim 1, wherein
a distance from each lens in the second lens assembly to the center of the second lens face is defined as a distance from a center of each lens in the second lens assembly to the center of the second lens face.

11. A proximity exposure machine optical system comprising:
a lamp;
at least one mirror; and
a fly eye lens, wherein the fly eye lens includes:
a first lens assembly which includes a plurality of lenses forming a first lens face; and
a second lens assembly which includes a plurality of lenses forming a second lens face,
the first lens face is used to split an incident broad light beam into narrow light beams and then refract the narrow light beams onto the second lens face, and the second lens face is used to dispersively refract the received narrow light beams onto a concave mirror in the optical system,
among the plurality of lenses in the second lens assembly, a lens which is closer to a center of the second lens face has a higher transmittivity than a lens which is farther from the center of the second lens face.

12. The proximity exposure machine optical system according to claim 11, wherein transmittivities of the lenses in the second lens assembly are between 60% and 100%.

13. The proximity exposure machine optical system according to claim 12, wherein
a lens closest to the center of the second lens face in the second lens assembly has a highest transmittivity among the plurality of lenses forming the second lens face.

14. The proximity exposure machine optical system according to claim 13, wherein
a distance from each lens in the second lens assembly to the center of the second lens face is defined as a distance from a center of each lens in the second lens assembly to the center of the second lens face.

15. The proximity exposure machine optical system according to claim 12, wherein
a distance from each lens in the second lens assembly to the center of the second lens face is defined as a distance from a center of each lens in the second lens assembly to the center of the second lens face.

16. The proximity exposure machine optical system according to claim 11, wherein
the transmittivity of each lens in the second lens assembly can be obtained by the following formulae:

$$\sum_{i,j} T_{ij} \times P_{Eij}(x, y) = P_0 - \Delta P$$

$$\Delta P = \Delta T = \frac{1}{t} \times \frac{K_1}{K_2} \times H \times \left[1 - \left(\frac{l}{L}\right)^n\right]$$

wherein $T_{ij}$ denotes a transmittivity of each lens in the second lens assembly, $$\sum_{i,j} T_{ij} \times P_{Eij}(x, y)$$

denotes illuminance on the concave mirror onto which the second lens face refracts the received light beams, $P_0$ denotes a known illuminance at a center of the concave mirror, $\Delta P$ denotes a difference of the illuminance at the selected point other than the center and the illuminance at the center, on the concave mirror to which the second lens face refracts the received light beams, ΔT denotes a difference of an illuminance at the selected point other than a center and an illuminance at the center, on a mask plate, to which the second lens face refracts the received light beams, in the optical system, t, n, $K_1$ and $K_2$ are constants, $0<K_1<1$, $0<K_2<1$, and $n>1$, l denotes a distance between the selected point other than the center on the mask plate and the center of the mask plate, L denotes a distance between the center of the mask plate and an intersection, which is a point at which a straight line formed by connecting the selected point on the mask plate and the center of the mask plate intersects with an edge of the mask plate, on the edge of the mask plate, and H denotes a maximum variation of amount of an exposure distance at the center of the mask plate.

17. The proximity exposure machine optical system according to claim 16, wherein
a distance from each lens in the second lens assembly to the center of the second lens face is defined as a distance from a center of each lens in the second lens assembly to the center of the second lens face.

18. The proximity exposure machine optical system according to claim 11, wherein
the transmittivities of the lenses in the second lens assembly are determined according to a bending degree of a mask plate caused by the proximity exposure machine optical system.

19. The proximity exposure machine optical system according to claim 18, wherein
a distance from each lens in the second lens assembly to the center of the second lens face is defined as a distance from a center of each lens in the second lens assembly to the center of the second lens face.

20. The proximity exposure machine optical system according to claim 11, wherein
a distance from each lens in the second lens assembly to the center of the second lens face is defined as a distance from a center of each lens in the second lens assembly to the center of the second lens face.

\* \* \* \* \*